United States Patent [19]

Rancoule et al.

[11] Patent Number: 5,433,901

[45] Date of Patent: Jul. 18, 1995

[54] METHOD OF MANUFACTURING AN ITO SINTERED BODY

[75] Inventors: Gilbert Rancoule, Monaca; Jerald L. Bliton, Beaver Falls, both of Pa.

[73] Assignee: Vesuvius Crucible Company, Wilmington, Del.

[21] Appl. No.: 141,555

[22] Filed: Oct. 26, 1993

Related U.S. Application Data

[63] Continuation-in-part of Ser. No. 16,239, Feb. 11, 1993, abandoned.

[51] Int. Cl.$^6$ .................... C04B 33/28; C04B 35/457
[52] U.S. Cl. ........................ 264/28; 264/64; 264/65; 264/63; 264/86; 501/126; 501/134; 501/121
[58] Field of Search .................. 264/64, 65, 86, 28, 264/63; 501/126, 134, 121

[56] References Cited

U.S. PATENT DOCUMENTS

| | | | |
|---|---|---|---|
| 4,624,808 | 11/1986 | Lange | 264/56 |
| 4,647,548 | 3/1987 | Klein . | |
| 4,962,071 | 10/1990 | Bayard . | |
| 5,047,182 | 9/1991 | Sundback | 264/28 |
| 5,071,800 | 12/1991 | Iwamoto et al. . | |
| 5,094,787 | 3/1992 | Nakajima et al. . | |
| 5,160,675 | 11/1992 | Iwamoto et al. | 501/134 |

FOREIGN PATENT DOCUMENTS 386932  12/1990  European Pat. Off. .

OTHER PUBLICATIONS

Reed, James S., Introduction to the Principles of Ceramic Processing, John Wiley & Sons, New York, 1988, pp. 440-445.

*Primary Examiner*—James Derrington
*Attorney, Agent, or Firm*—Sixbey, Friedman, Leedom & Ferguson

[57] ABSTRACT

The invention encompasses a method for manufacturing a high density indium oxide/tin oxide (ITO) sintered body, as well as the ITO sintered body itself. The method produces an ITO sintered body of high homogeneity for use as a sputtering target in manufacturing processes where thin, transparent and electrically conductive ITO layers are deposited over transparent substrates. The method comprises the steps of preparing a slurry whose solid constituents consist of a finely divided mixture of between 99 and 50 weight percent of $In_2O_3$ and 1 to 50 weight percent of $SnO_2$, and between about 0.05 through 0.25 percent of a sintering agent formed from an oxide of, only one of the group consisting of aluminum, magnesium, yttrium, and silicon; forming the resulting slurry into a green body having a density of between about 4.0 and 4.8 gm/c$^3$ and heating the green body to a sintering temperature of between about 1500 and 1600 C. while maintaining a flow of oxygen over the green body sufficient to avoid the creation of a reducing atmosphere around the body, but insufficient to cause substantial disassociation of the $In_2O_3$ and $SnO_2$. The green body may be formed by casting the resulting slurry or by adding a powdered binder to the slurry, spray drying it, and cold pressing the resulting powder.

53 Claims, 3 Drawing Sheets

METHOD OF MANUFACTURING AN ITO SINTERED BODY

BACKGROUND OF THE INVENTION

This application is a continuation-in-art of U.S. patent application Ser. No. 08/016,239 filed Feb. 11, 1993 now abandoned.

This invention generally relates to a method for producing an indium oxide/tin oxide (ITO) sintered body characterized by high density and high homogeneity which is particularly useful as a sputtering target.

Methods for manufacturing ITO sintered bodies for use as sputtering targets are known in the prior art. Such sintered bodies are useful in depositing transparent and electrically conductive films onto transparent substrates. When so used, the ITO sintered body (which usually takes the form of a flat plate) overlies a magnetic field source, while the substrate to be coated typically overlies the sintered body in a spaced-apart relationship. When the sintered body is bombarded with high energy electrons, ions of both indium oxide and tin oxide are created. These ions are carried up from the top surface of the sintered body to the bottom surface of the substrate via a sputtering action, which over time creates a transparent and electrically conductive layer of ITO over the substrate. Recent applications for such ITO-coated substrates include liquid crystal display devices, thin-film electroluminescent display devices, television and computer terminal screens, radiation detector elements, defogging heater films for window panes, antistatic films, and selective permeable membranes for solar heat collectors.

When used as a sputtering target, the ITO sintered body should be as close as possible to maximum theoretical density, for two reasons. First, the use of a high density sintered body maximizes its useful life as a sputtering target, and thereby minimizes the amount of down-time associated with the replacement of the body as it is eroded away as a result of the electron bombardment. While it might seem possible to protract the life span of the sintered body by merely increasing its thickness, such a solution is impractical due to the fact that the magnetic field traversing the thickness of the plate-shaped ITO body must be of a certain minimum magnitude for the sputtering process to operate. Since the strength of the magnetic field diminishes with the square of the distance from its source, the plate-shaped ITO sintered body cannot be made beyond a certain thickness, or the magnetic field at its upper surface will not be sufficiently strong to implement the sputtering operation. Accordingly, long target life can only be achieved by high density and not by merely increasing the thickness of the sputtering target. A second reason why a high density is desirable is the increase in thermoconductivity which inherently results. Such a relatively higher thermoconductivity minimizes thermal tensile stresses that naturally occur in the plate-shaped sintered body during the sputtering operation which could otherwise create cracks in the body. Such cracks are undesirable, as they could result in a non-uniform deposition of the ITO.

In addition to high density, a further desirable physical characteristic of the ITO sputtering target is a homogeneous distribution of $In_2O_3$ and $SnO_2$. Such a homogeneous distribution results in the homogeneous deposition of both indium oxide and tin oxide on the substrate when the sputtering operation is carried out, which in turn results in an ITO film having uniform physical and electrical characteristics. Still another desirable characteristic of the ITO sintered body is that it be as pure as possible, and have only an absolutely minimum amount of sintering agents which, because of their electrically insulative properties, could disadvantageously interfere with the conductivity of the resulting ITO film. Ideally, the ITO sintered body could be manufactured with a curved profile, instead of into just a flat plate, so that substrates having a curved profile, such as the windshields of high-tech fighter planes, could be uniformly ITO covered. Finally, such an ITO sintered body should be relatively inexpensive and easy to manufacture, without the need for expensive machinery that is time consuming to operate.

Unfortunately, none of the manufacturing methods known in the prior art is capable of producing an ITO sintered body which fulfills all of the aforementioned criteria. For example, while Nakajima et al U.S. Pat. No. 5,094,787 discloses a method of manufacturing an ITO sputtering target having a density of 7.06 $gm/cm^3$ (which is 98% of maximum theoretical density), it does so by means of a process which requires the press molding of the mixed, particulate constituents of the body at a pressure of between 750 and 1000 $kg/cm^2$ followed by the sintering of the resulting green body in a furnace containing an oxygen atmosphere pressurized at between 2 and 11 atmospheres. The oxygen pressured sintering furnace which must be used in the sintering step constitutes expensive and sophisticated equipment. Finally, the dry mixing of the indium oxide and tin oxide used to form the green body necessarily results in some inhomogeneities in the distribution of these two constituents, which in turn can cause inhomogeneities in the ITO films created by the sintered body that results from this method.

Bayard U.S. Pat. No. 4,962,071 also discloses a process whereby a sintered ITO body exceeding 90% theoretical density may be produced. However, this patent teaches incorporating a relatively high percentage of insulative sintering agents into the ITO body which in turn can interfere with the conductivity of the ITO film created thereby (i.e., the disclosed aluminum oxide and silicon dioxide sintering agents may form as much as 10 weight percent each of the total indium oxide/tin oxide mixture).

Clearly, there is a need for a new method for manufacturing dense ITO sintered bodies which avoids the shortcomings associated with the prior art, and fulfills all the aforementioned ideal criteria.

SUMMARY OF THE INVENTION

Generally speaking, the invention is a method for manufacturing a high density ITO sintered body of high homogeneity that overcomes or at least ameliorates all of the shortcomings associated with prior art manufacturing methods. In its broadest sense, the method comprises the steps of preparing a slurry whose solid constituents consist of a finely divided mixture of $In_2O_3$, $SnO_2$ and a very small amount (i.e. between about 0.01 and 0.5 percent by weight) of an oxide other than an oxide of indium or tin that acts as a sintering agent; forming the slurry into a green body having a density of between about 4.0 to 4.8 $gm/cm^3$, and heating the green body to a sintering temperature in an oxygen atmosphere pressurized to only slightly above ambient pressure. The green body may be formed from the slurry by slip casting, freeze casting, pressure casting or electrocasting, or by spray drying the slurry and compacting the resulting powder in a press.

The sintering agent oxide is a compound capable of glassy phase formation, and is preferably an oxide of only one of the group consisting of aluminum, yttrium, magnesium, and silicon. Most preferably, the sintering agent oxide is silicon dioxide ($SiO_2$). The amount of sintering agent oxide should be lower than 0.25 percent, and in the preferred method, no more than 0.05 weight percent of $SiO_2$ is used in order both to maximize the density of the resulting sintered body, as well as to minimize the electrical resistance that the insulative silicon dioxide imposes in the resulting body.

The ratio of $In_2O_3$ and $SnO_2$ used to form the slurry may be between about 99 and 50 weight percent of $In_2O_3$ and 1 to 50 weight percent of $SnO_2$, and is more preferably between 95 and 55 weight percent of $In_2O_3$ and 5 to 45 weight percent of $SnO_2$, and is most preferably between about 90 and 60 weight percent of $In_2O_3$, and 10 and 40 percent $SnO_2$. While both the $In_2O_3$ and $SnO_2$ are finely divided powders, the method of the invention advantageously does not require these powders to be ultrafine. The mean diameter of the particles of both the $In_2O_3$ and $SnO_2$ may be between 1.5 and 0.1 microns, and is preferably in the range of between about 0.40 and 0.80 microns. Similarly, the surface area of both of these particulate constituents is between about 5 and 15 $m^2/gm$ and is most preferably about 8 $m^2/gm$. Each of the solid constituents of the slurry is preferably 99.9 percent pure so as not to interfere with the homogeneity of the resulting sintered body.

The slurry formation step of the invention serves both to uniformly mix the solid constituents, as well as to grind the individual solid particles to the desired diameters and surface areas. To this end, the slurry is formed in a ball mill by adding water or an organic solvent to $In_2O_3$ and $SnO_2$ powder. When water is used as the liquid constituent, the pH is adjusted so that the mobility of the particulate matter that forms the solid constituents of the slurry is sufficiently high to facilitate a complete and homogeneous mixing of this particulate matter. To this end, the pH can be adjusted to be acidic on the order of between 3.0 to 4.0, or alkaline on the order of between 7.5 and 10.0. Most preferably, the pH is adjusted between 7.5 and 10.0, as the alkalinity of the resulting slurry is less apt to corrode the materials which normally form the casting molds when casting is used to consolidate the solid constituents of the slurry. Additionally, a deflocculant is included within the liquid constituents of the slurry to aid the particles in becoming dispersed and staying dispersed, which in turn further promotes homogenous mixing.

In the heating step of the method, the green body is preferably heated to between about 1500° and 1600° C. for between about 4 and 20 hours, and is most preferably heated to a temperature of between 1540° and 1570° C. for a time period between 8 and 12 hours. The sintering step is carried out in an oxygen atmosphere, and preferably under circumstances where a flow of oxygen is continuously provided over the green body, wherein the rate of the flow is sufficient to avoid the creation of a reducing atmosphere around the green body, but insufficient to cause substantial disassociation of the $In_2O_3$ and $SnO_2$.

The method may further include the advantageous step of casting the aforementioned slurry in a curved mold in order to create a sintered body having a curved contour useful for depositing a transparent, electrically conductive layer of ITO on a curved substrate, such as the windshield of a fighter plane.

Finally, the invention encompasses the sintered body article produced by the aforementioned method.

BRIEF DESCRIPTION OF THE SEVERAL FIGURES

DETAILED DESCRIPTION OF THE PREFERRED EMBODIMENT

Figure 1:
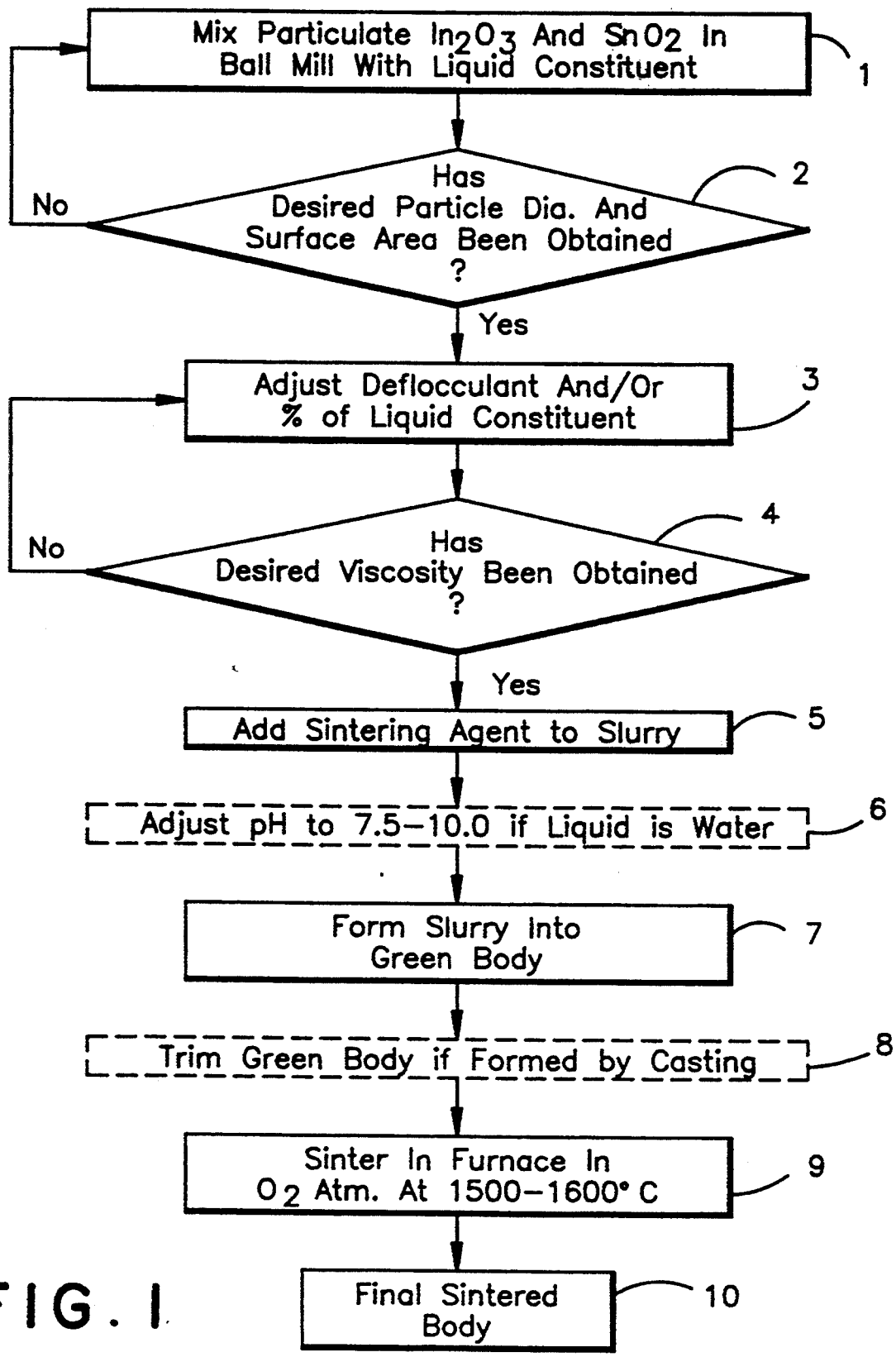
FIG. 1 is a flow chart that schematically depicts the method of the invention.

With reference now to FIG. 1, the first steps 1, 2 of the invention comprise mixing particulate $In_2O_3$ and $SnO_2$ in a conventional ball mill until the desired average diameter and surface area of the particulate $In_2O_3$ and $SnO_2$ have been obtained. When water is used as the liquid constituent, this step is preferably carried out by mixing particulate $In_2O_3$ and $SnO_2$ with approximately 80% of the water necessary to form the final slurry. Whether water or an organic solvent such as alcohol is used, both the average particle diameter and surface area are periodically checked until the average particle diameter is between about 0.4 and 0.8 microns, and the surface area of the particles is between about 7 and 9 $m^2/gm$. While the ratio of the two particulate constituents may vary anywhere between 99 and 50 weight percent of $In_2O_3$ and 1 to 50 weight percent of $SnO_2$, the preferred ratio of these constituents falls between 95 and 60 percent $In_2O_3$ and 5 to 40 percent $SnO_2$.

In the next steps 3, 4 of the method, the viscosity of the slurry is adjusted to a desired level by adjusting the amount of deflocculant or suspending agents in the slurry and/or the percentage of liquid constituent in the slurry. If the slurry is water-based and will be used to slip cast the green body, about 25% more water is added to the mixture in the ball mill, along with a sufficient amount of deflocculant to adjust the viscosity of the slurry to a reasonable range for slip casting (between about 100 to 200 cps). Because the pH of the slurry will ultimately have to be rendered alkaline to achieve the desired mobility of the particulate $In_2O_3$ and $SnO_2$, an ammonia-based deflocculant is used for this purpose. If the slurry is to be used for freeze casting, it is thickened to about 2000 centipoise by the addition of suitable flocculants whose composition will depend on whether the liquid constituent of the slurry is water or an organic solvent such as alcohol. If the green body is to be formed by cold pressing, then the viscosity of the slurry is adjusted to a level which facilitates spray drying, i.e., between 150 and 500 centipoise.

After the desired viscosity has been obtained, the sintering agent is added to the slurry as indicated in step 5 of FIG. 1. In the preferred method, this sintering agent is silica or $SiO_2$, although an oxide of aluminum, yttrium, or magnesium may also be used. To facilitate a highly homogeneous distribution of the sintering agent all throughout the slurry, the average diameter of the particles of is on the order of 0.10 microns or less. While as much as 0.25% by weight of sintering agent may be added to the slurry, 0.05 weight percent of $SiO_2$ is added in the preferred method of the invention as the applicant has surprisingly found that the density of the resulting final sintered body is the highest at that level for all the sintering agents, and actually drops from 6.7 gm/cm$^3$ to 6.0 gm/cm$^3$ as the amount of $SiO_2$ sintering agent is increased between 0.05 weight percent and 0.25 weight percent in the slurry.

Figure 2:
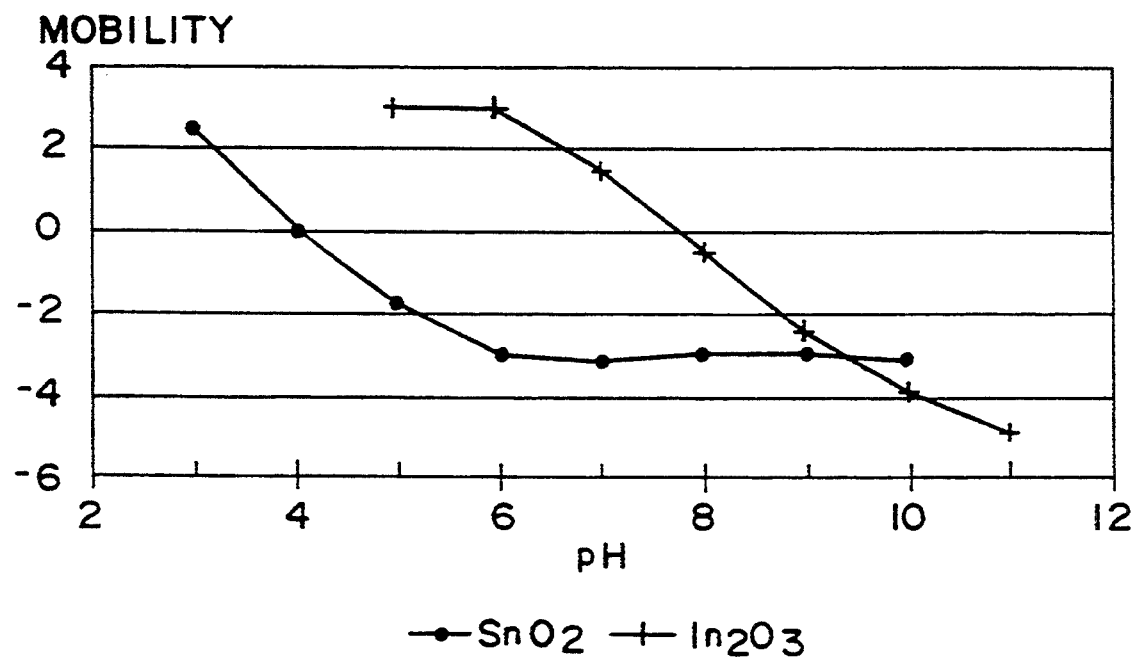
FIG. 2 is a graph illustrating the relationship between the mobility of the particulate $In_2O_3$ and $SnO_2$ in the slurry relative to the pH of the slurry when the liquid constituent is water.

Step 6 of FIG. 1 is implemented only if the liquid constituent of the slurry is water. In this step, the pH of the slurry is adjusted to anywhere between 7.5 and 10.0 by adding a sufficient amount of an alkaline agent such as ammonium hydroxide. As is clearly indicated in the graph of FIG. 2, when the pH of such a water-based slurry rises above 7.0, the individual particles of $In_2O_3$ and $SnO_2$ acquire a relatively negative charge relative to the surrounding slurry constituents, which in turn discourages them from agglomerating, and gives them a high degree of mobility relative to the surrounding slurry constituents. After the pH has been so adjusted, the ball mill is again actuated in order to create a truly homogeneous mixture of particulate $In_2O_3$, $SnO_2$, and the particles of sintering agent. After the pH of the slurry has been adjusted as described and the slurry has been thoroughly mixed to create the desired homogeneous mixture of its solid constituents, it is then formed into a green body. It may, for example, be transferred from the ball mill and poured into a slip cast to create the green ITO body. In this embodiment of the method, a conventional plaster mold is used. Additionally, the slurry is introduced and maintained into this mold at a pressure of between about 1 and 2 bars in order to both reduce the molding time, and to prevent the creation of any voids in the green body. Alternatively, the slurry may be freeze-cast in conformance with, for example, the method disclosed in U.S. Pat. No. 5,047,182, the entire specification of which is hereby expressly incorporated herein by reference. Or, the slurry may be spray dryed after a binder has been added to the slurry to create flowable, compactable agglomerates of particles between about 40 and 150 microns in diameter which are suitable for isopressing or hydraulic pressing. Compounds suitable for use as binders include polyvinyl alcohols, polyethylene glycol, carbomethylcellulose, stearates, microcreptalline waxes, latex emulsions, polyethylene oxides, hydroxyethylcellulose, natural gums and cellulosic ethers.

If the green body is formed by casting, it is removed and trimmed after it has had a sufficient time to harden within the mold as is indicated in step 8 of FIG. 1. The density of the resulting green body is between about 4.0 and 4.8 gm/cm$^3$, and the compaction of the particulate constituents of the slurry is dense and tight enough to give the resulting green body sufficient structural integrity so that it may be removed from its mold and transferred to a furnace without breaking.

After the green body has been allowed to dry, it is transferred into a conventional ceramic furnace and heated to a sintering temperature of between about 1500° and 1600° C. as is indicated in step 9 of FIG. 1. If the green body has been formed by cold pressing, it is subjected to a binder burnout step (to be described later) between the drying and sintering steps. All during the sintering operation, the green body is exposed to an atmosphere of substantially pure oxygen. This step is implemented by continuously providing a flow of oxygen into the furnace at a pressure which is only slightly above ambient pressure. The continuous flow of oxygen avoids the creation of a reducing atmosphere around the green body which could cause metallic indium or tin to form therein. At the same time, the relatively slow flow rate of the oxygen that continuously enters and leaves the furnace avoids the creation of an excessively oxidizing atmosphere which could cause the complete disassociation of the ITO and consequent erosion of the green body. After the sintering operation has been completed, the resulting sintered body is removed as indicated in step 10 of FIG. 1.

More specific examples of both the method of the invention, and the sintered body produced thereby are as follows:

EXAMPLE 1

18,900 grams (90 weight percent) of finely divided indium oxide was mixed with 2,100 grams (9.99 weight percent) of tin oxide in a ball mill along with 4,000 grams of water to create a slurry. The ball mill was operated until the average diameter of the $In_2O_3$ and $SnO_2$ particles was between 0.40 and 0.80 microns, and the average area of these particles was 8 m$^2$/g. Eight hundred grams of water along with 150 grams of an ammonia deflocculant was then added to the slurry in order to brings its viscosity down to about 150 cps. Next, 52.5 grams (0.25 weight percent) of $Al_2O_3$ was added to the resultant slurry, the average diameter of the $Al_2O_3$ particles being only about 0.10 microns or less, and the average surface area of these particles being over 25 m$^2$/gm. Twenty grams of ammonia hydroxide was then added to the slurry to bring its pH to approximately 8.5. The resulting slurry was then slip cast into a plaster mold under 1 to 2 bars pressure for approximately 30 minutes to create a flat, brick, shaped green body whose dimensions were 8 inches by 6 inches, by ⅜ inch, and whose density was approximately 4.5 gm/cm$^3$. The green body was trimmed, and then sintered in a furnace for 10 hours at 1540° C. During the sintering operation, a substantially pure oxygen atmosphere was maintained within the furnace by continuously flowing pure oxygen in to the interior of the furnace at a pressure slightly above ambient atmospheric pressure. The final sintered body had a density of 6.3 gm/cm$^3$, which is 88% of maximum theoretical density.

EXAMPLE 2

Exactly the same procedure that was described in Example 1 was followed, the only exception being the addition of 10 grams (0.05 weight percent) of silicon dioxide in to the slurry after the viscosity of the slurry had been lowered to 150 cps. The resulting sintered body had a density of 6.7 grams per cubic centimeter, or 93% of the maximum theoretical density.

EXAMPLE 3

In this example, the same procedure as described in Example 1 was followed, the only difference being that the solid constituents of the slurry consisted of 12,600 grams of $In_2O_3$ (59.97 weight percent), and 8400 grams of $SnO_2$ (39.95 weight percent), and 20 grams of silicon dioxide (0.10 weight percent). The resulting sintered body had a density of 6.43 gm/cm$^3$.

EXAMPLE 4

Exactly the same procedure that was described in Example 1 was followed, the only exception being the addition of 52.5 grams (0.25 weight percent) of silicon dioxide into the slurry after the viscosity of the slurry had been lowered to 150 cps. The resulting sintered body had a density of 6.0 gm/cm$^3$, or 83% of the maximum theoretical density.

Figure 3:
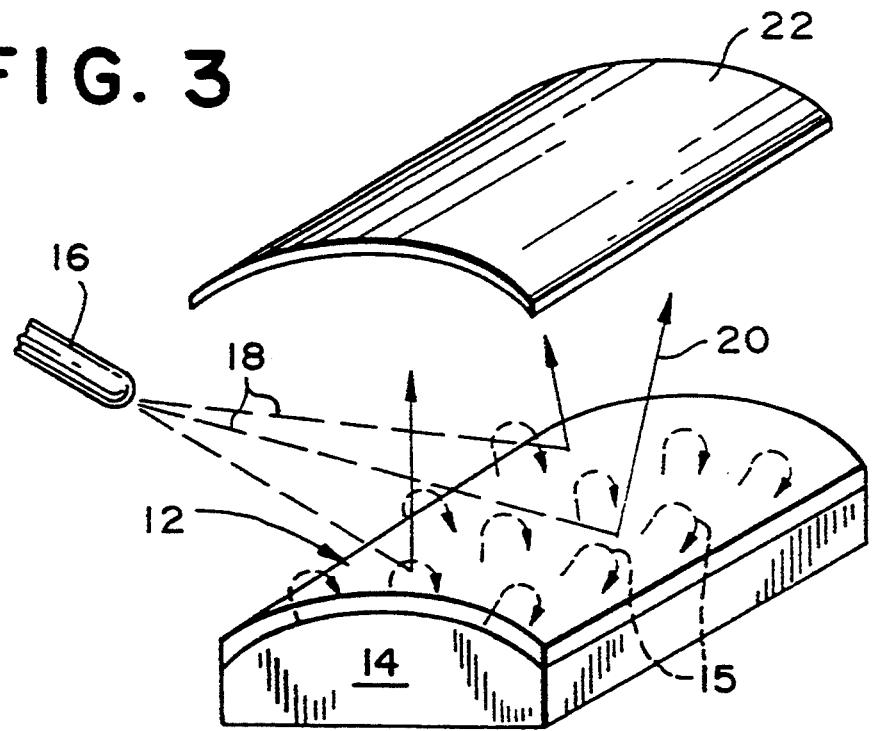
FIG. 3 is a perspective, schematicized view of how an ITO sintered body that has been cast into a curved shape may advantageously be used to uniformly deposit an ITO film on a curved glass substrate.

FIG. 3 illustrates the advantages associated with creating the green body by slip casting, as opposed to a pressing technique. Such slip casting allows the fabrication of a curved green body 12, which is particularly useful when the ultimate purpose of the resulting sintered body is to deposit a thin, transparent, and electrically conductive ITO film onto a curved, transparent substrate 22, which may be a section of a cockpit of a jet fighter plane. In such an application, the curved sintered body 12 overlies an electromagnetic source 14 whose upper surface is complementary in shape to the contour of the sintered body 12. The electromagnetic source 14 emanates a magnetic flux 15 uniformly throughout the sintered body 12 at the same time an electron gun 16 emanates a stream of electrons 18 over the surface. The impinging electrons, in combination with the lines of magnetic flux emanated by the electromagnetic source 14, create ions of indium/tin oxide which are uniformly deposited on the underside of the transparent substrate 22 by virtue of the fact that the contour of the upper surface of the sintered body 12 is the same of the contour of the lower surface of the transparent substrate 22.

EXAMPLE 5

Three thousand one hundred fifty (3,150) grams (90 weight percent) of finely divided indium oxide was mixed with 350 grams (10 weight percent) of tin oxide in a ball mill along with 800 grams of water to create a slurry. The ball mill was operated until the average diameter of the In$_2$O$_3$ and SnO$_2$ particles was between 0.40 and 0.80 microns, and the average area of these particles was 8 m$^2$/gm. Next, 1.75 grams (0.05 weight percent) SiO$_2$ was added to the resultant slurry to serve as a sintering agent, the average diameter of the SiO$_2$ particles being only 0.10 microns or less, and the average surface area of these particles being over 25 m$^2$/gm. One hundred twenty-three (123) grams of polyethelene glycol binder was then added to and mixed into the slurry. The slurry was then spray dried to create particle agglomerates having an average diameter of between 40 and 150 microns, and a moisture content of only about 0.20 percent by weight. Four hundred grams of the agglomerated particles were then loaded into a mold, which in this example was a plastic bag. The loaded bag was then subjected to a near vacuum to de-air it and thus facilitate the pressing step. The de-aired loaded bag was then placed in an isostatic press and subjected to a pressure of 20,000 lbs/in$^2$. The resulting pressed body was allowed to dry for about one day and then heated to a temperature of about 300° C. for three days in order to burn off the binder. The resulting green body had a density of 4.3 gm/cm$^3$ and was subjected to the same firing cycle as described with respect to Example 1. The resulting sintered body had a density of 6.37 gm/cm$^3$ which is 89% of maximum theoretical density.

EXAMPLE 6

Exactly the same procedure as described in Example 5 was followed, the only exception being that 3.5 grams (0.10 weight percent) of SiO$_2$ was added to the slurry to serve as a sintering agent. The resulting green body again had a density of 4.3 gm/cm$^3$, and the final sintered body had a density of 5.88 gm/cm$^3$, which is 81% of maximum theoretical density.

EXAMPLE 7

The same procedure as described in Example 5 was followed, the only exception being that 8.75 gm (0.25 weight percent) of SiO$_2$ was added to the slurry to serve as a sintering agent. The resulting green body had a density of 4.3 gm/cm$^3$, and the final sintered body had a density of 5.56 gm/cm$^3$, which is 77% of maximum theoretical density.

EXAMPLES 8-16

The following table summarizes the densities of the final ITO sintered body obtained with 0.05, 0.10, and 0.25 weight percents of Al$_2$O$_3$, MgO, and Y$_2$O$_3$, respectively:

| Agent | Density of Final Sintered Body (gm/cm$^3$) | | |
|---|---|---|---|
| Al$_2$O$_3$ | 5.88 | 5.88 | 5.88 |
| MgO | 5.72 | 5.88 | 5.88 |
| Y$_2$O$_3$ | 5.72 | 5.88 | 5.72 |
| SiO$_2$ | 6.37 | 5.88 | 5.56 |
| | .05% | 0.10% | .25% |
| | | Weight % | |

Figure 4:
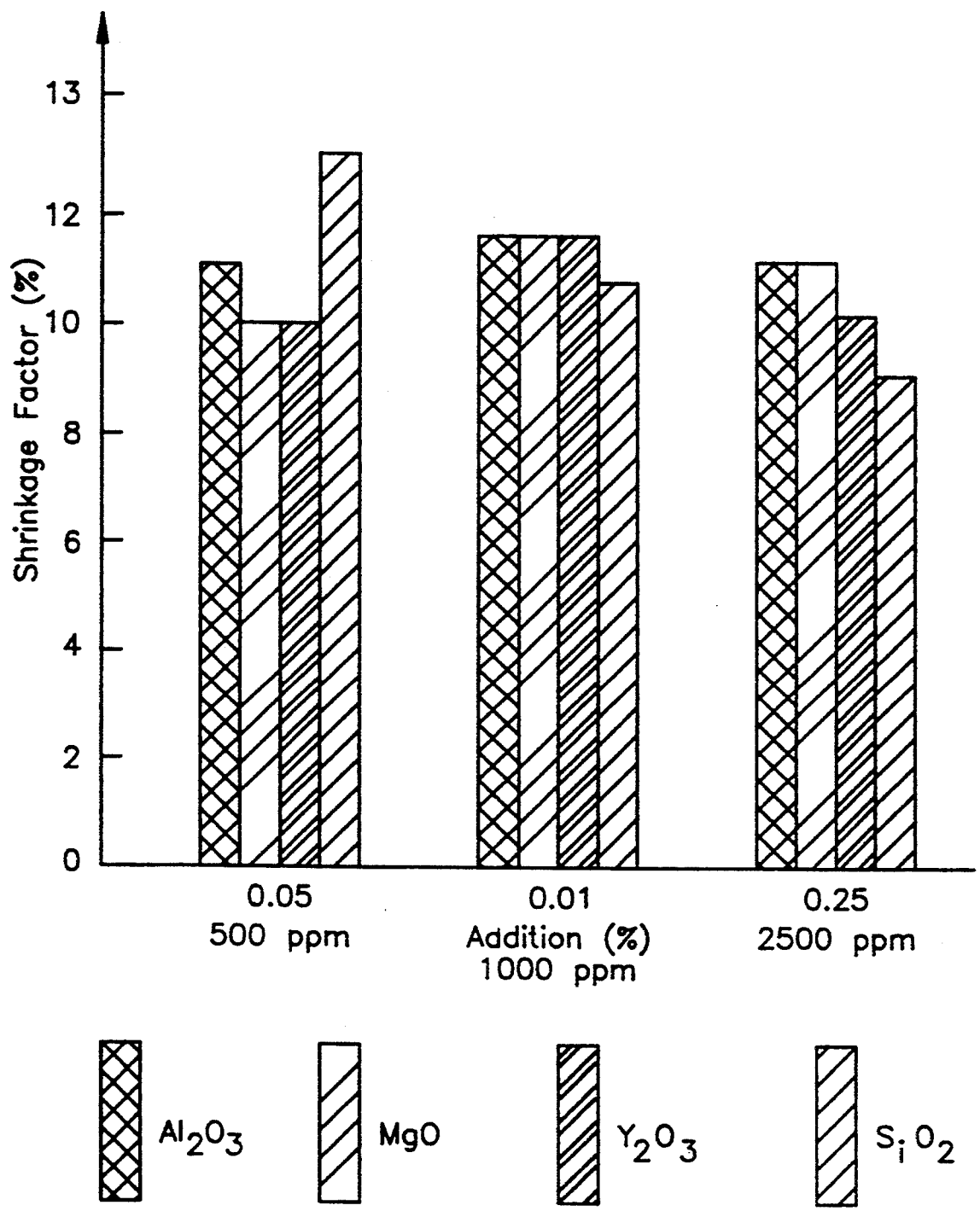
FIG. 4 is a graph illustrating the shrinkage factors associated with different sintering agents at different weight percentages in the ITO mixture.

The results of all of the Examples 5-16 are summarized in FIG. 4 in terms of the extent to which the samples shrunk along one of their three axes during the sintering step. As is evident from both the above table and the graph of FIG. 4, the best results are obtained with silica, and the second best results with alumina.

We claim:

1. A method for manufacturing a high density ITO sintered body of high homogeneity, comprising:
   preparing a slurry whose solid constituents consist of a finely divided mixture of In$_2$O$_3$, SnO$_2$ and between about 0.05 and 0.25 percent by weight of a sintering agent consisting of only one oxide selected from the group consisting of aluminum oxide, calcium oxide, yttrium oxide, cesium oxide, magnesium oxide and silicon dioxide;
   forming said slurry into a green body having a density of between about 4.2-4.8 gm/c$^3$, and
   heating said green body to a sintering temperature in an oxygen atmosphere.

2. The method of claim 1, wherein said green body is heated for a time period of between 4 and 20 hours.

3. The method of claim 1, wherein said oxide is SiO$_2$.

4. The method of claim 1, wherein said green body is heated to a temperature of between about 1500°-1600° C.

5. The method of claim 1, wherein a flow of oxygen is continuously provided over the green body during the heating thereof to create said oxygen atmosphere.

6. The method of claim 5, wherein the rate of said flow is sufficient to avoid the creation of a reducing atmosphere around said green body, but insufficient to cause substantial disassociation of the In$_2$O$_3$ and SnO$_2$.

7. The method of claim 5, wherein said flow of oxygen is provided by enclosing said green body in a kiln, and by continuously admitting oxygen into the kiln at a pressure slightly above ambient atmospheric pressure.

8. The method of claim 1, wherein the pH of the slurry is adjusted to between about 7.5 and 10 to facilitate a complete and homogeneous mixing of the finely divided solid constituents.

9. The method of claim 1, wherein said solid slurry constituents consist of between about 99 and 50 weight percent of $In_2O_3$ and 1 to 50 weight percent of $SnO_2$.

10. The method of claim 1, wherein the average particle diameter of the finely divided $In_2O_3$, $SnO_2$ and sintering agent oxide is 1 micron or less.

11. The method of claim 1, wherein the area per weight of the finely divided $In_2O_3$, $SnO_2$ and sintering agent oxide ranges between about 5 and 15 $m^2/gm$.

12. The method of claim 1, wherein the pH of the slurry is adjusted to between about 3.0 and 4.0 to facilitate a complete and homogeneous mixing of the finely divided $SnO_2$ and the finely divided $In_2O_3$.

13. A method for manufacturing a high density ITO sintered body of high homogeneity comprising:
preparing a slurry whose solid constituents consist of a finely divided mixture of between about 99 and 50 weight percent of $I_{n2}O_3$ and 1 to 50 weight percent of $SnO_2$, and between about 0.05 and 0.25 weight percent of a sintering agent consisting of only one oxide selected from the group consisting of aluminum oxide, calcium oxide, yttrium oxide, cesium oxide, magnesium oxide, and silicon dioxide;
forming said slurry into a green body having a density of between about 4.2–4.8 $gm/c^3$, and
heating said green body to a temperature of between about 1500°–1600° C. to sinter said green body while maintaining a flow of oxygen over said green body sufficient to avoid the creation of a reducing atmosphere around said body but insufficient to cause substantial disassociation of the $In_2O_3$ and $SnO_2$.

14. The method of claim 1, wherein the average particle diameter of the finely divided $In_2O_3$, $SnO_2$ and sintering agent oxide is between about 0.4 and 0.8 microns.

15. The method of claim 13, wherein the area per weight of the finely divided $In_2O_3$, $SnO_2$ and sintering agent oxide ranges between about 5 and 15 $m^2/gm$.

16. The method of claim 13, wherein the liquid constituents of said slurry consist of water, a deflocculant to disperse the particles, and a hydroxide to adjust the pH of the resulting slurry to facilitate a complete and homogeneous mixing of the finely divided solid constituents.

17. The method of claim 16, where a sufficient amount of said hydroxide is added to the slurry to adjust the pH between 7.5 and 10.

18. The method of claim 13, wherein said flow of oxygen is provided by enclosing said green body in a kiln, and by continuously admitting oxygen into the kiln at a pressure slightly above ambient atmospheric pressure.

19. The method of claim 13, wherein said green body is heated for a time period of between 4 and 20 hours.

20. The method of claim 13, wherein said green body is heated between about 8 and 12 hours.

21. The method of claim 13, wherein said sintering agent is $SiO_2$.

22. A method for manufacturing a high density ITO sintered body of high homogeneity, comprising:
preparing a slurry whose solid constituents consist of a finely divided mixture of between about 95 and 55 weight percent of $In_2O_3$ and 5 to 45 weight percent of $SnO_2$, and between about 0.05 and 0.25 weight percent of an oxide consisting of only one oxide selected from the group consisting of aluminum oxide, calcium oxide, yttrium oxide, cesium oxide, magnesium oxide, and silicon dioxide, and whose liquid constituents consist of water, and a basic deflocculant to facilitate a complete and homogeneous mixing of the finely divided solid constituents;
forming said slurry into a green body having a density of between about 4.2–4.8 $gm/c^3$, and
heating said green body to a temperature of between about 1500°–1600° C. for a time period of between about 8 to 12 hours while maintaining a flow of oxygen over said green body sufficient to avoid the creation of a reducing atmosphere around said body but insufficient to cause substantial disassociation of the $In_2O_3$ and $SnO_2$.

23. The method of claim 22, wherein said slurry is slip casted into a curved mold to create a curved green body.

24. A method for manufacturing a high density ITO sintered body, comprising the steps of:
preparing a mixture consisting of finely divided $In_2O_3$ and $SnO_2$ and between about 0.05 and 0.25 percent by weight of a sintering agent consisting of only one of an oxide selected from the group consisting of aluminum oxide, magnesium oxide, yttrium oxide, and silicon dioxide;
forming said mixture into a green body having a density of about 4.0 $gm/cm^3$ or greater, and
heating said green body to a sintering temperature in an oxygen atmosphere.

25. The method of claim 24, wherein said sintering agent is between about 0.05 and 0.10 weight percent of said mixture and consists of silicon dioxide.

26. The method of claim 24, wherein said sintering agent is between about 0.05 and 0.10 weight percent of said mixture and consists of $Al_2O_3$.

27. The method of claim 24, wherein said sintering agent is about 0.10 weight percent of said mixture and consists of only one of the group consisting of MgO and $Y_2O_3$.

28. The method of claim 24, wherein said mixture includes a liquid constituent that forms a slurry with the finely divided $In_2O_3$ and $SnO_2$, and said green body is formed by casting said slurry into a mold.

29. The method of claim 28, wherein the liquid constituent of said mixture is substantially water.

30. The method of claim 28, wherein the liquid constituent of said mixture is substantially a non-aqueous liquid.

31. The method of claim 29, wherein said non-aqueous liquid is alcohol.

32. The method of claim 28, wherein said mixture is mixed in a ball mill prior to said casting step to uniformly mix said finely divided $In_2O_3$ and $SnO_2$ and to reduce the average diameter of the particles of $In_2O_3$ to under 1 micron and the average area of said particles to between about 5 and 15 $m^2/gm$.

33. The method of claim 28 wherein said slurry is slip casted into said mold.

34. The method of claim 28, wherein said slurry is pressure casted by injecting said slurry under pressure into said mold.

35. The method of claim 28, wherein said slurry is freeze casted into said mold.

36. The method of claim 28, wherein said slurry is electro-casted into said mold.

37. The method of claim 24, wherein said mixture includes a binder, and said green body is formed by pressing said powder.

38. The method of claim 37, wherein said mixture is cold pressed into said green body.

39. The method of claim 37, wherein said mixture is isostatically pressed into said green body.

40. The method of claim 37, wherein said mixture is uniaxially pressed into said green body.

41. The method of claim 37, wherein said mixture is subjected to about 20,000 lbs/in$^2$ pressure.

42. The method of claim 24, wherein said green body is heated to between about 1500°–1600° C. for a time period of between 4 and 20 hours.

43. The method of claim 24, wherein a flow of oxygen is continuously provided over the greed body during the heating thereof to create said oxygen atmosphere, the rate of said flow being sufficient to avoid the creation of a reducing atmosphere around said green body, but insufficient to cause substantial disassociation of the $In_2O_3$ and $SnO_2$.

44. A method for manufacturing a high density ITO sintered body, comprising the steps of:

preparing an aqueous slurry consisting of water and finely divided $In_2O_3$ and $SnO_2$ and between about 0.05 and 0.25 percent by weight of a sintering agent consisting of only one of an oxide selected from the group consisting of aluminum oxide and silicon dioxide;

forming said slurry into a green body having a density of about 4.0 gm/cm$^3$ or greater, and heating said green body to a sintering temperature in an oxygen atmosphere by continuously flowing oxygen around said body, the rate of said flow being sufficient to avoid creation of a reducing atmosphere around said green body, but insufficient to cause substantial disassociation of the $In_2O_3$ and $SnO_2$.

45. The method of claim 44, wherein said oxide is $SiO_2$.

46. The method of claim 45, wherein said mixture is mixed in a ball mill prior to said casting step to uniformly mix said finely divided $In_2O_3$ and $SnO_2$ and to reduce the average diameter of the particles of $In_2O_3$ and $SnO_2$ to between about 0.40 and 0.80 microns and the average area of said particles to 8 m$^2$/gm.

47. The method of claim 45, wherein said green body is heated to a temperature of between about 1500°–1600° C.

48. The method of claim 45, wherein a flow of oxygen is continuously provided over the green body during the heating thereof to create said oxygen atmosphere.

49. The method of claim 47, wherein the pH of the slurry is adjusted to between about 7.5 and 10 to facilitate a complete and homogeneous mixing of the finely divided mixture.

50. The method of claim 45, wherein the liquid constituents of said slurry consist of water, a deflocculant to disperse the particles, and a hydroxide to adjust the pH of the resulting slurry to facilitate a complete and homogeneous mixing of the finely divided mixture.

51. The method of claim 44, wherein the liquid constituents of said slurry consist of water, a deflocculant to disperse the particles, and a hydroxide to adjust the pH of the resulting slurry to facilitate a complete and homogeneous mixing of the finely divided solid constituents.

52. The method of claim 45, wherein said slurry is cast into a curved mold to create a curved green body.

53. The method of claim 44, wherein said sintering agent consists of between about 0.05 and 0.10 weight percent of $SiO_2$.

* * * * *